(12) United States Patent
Guillemenet et al.

(10) Patent No.: US 9,368,204 B2
(45) Date of Patent: Jun. 14, 2016

(54) VOLATILE/NON-VOLATILE MEMORY CELL

(75) Inventors: Yoann Guillemenet, Crest (FR); Lionel Torres, Combaillaux (FR); Guillaume Prenat, Grenoble (FR); Kholdoun Torki, Fontaine (FR); Gregory Di Pendina, Echirolles (FR)

(73) Assignee: Centre National de la Recherche Scientifique Universite Montpellier 2 (FR)

( * ) Notice: Subject to any disclaimer, the term of this patent is extended or adjusted under 35 U.S.C. 154(b) by 96 days.

(21) Appl. No.: 13/980,559

(22) PCT Filed: Jan. 19, 2012

(86) PCT No.: PCT/EP2012/050767
§ 371 (c)(1),
(2), (4) Date: Nov. 21, 2013

(87) PCT Pub. No.: WO2012/098181
PCT Pub. Date: Jul. 26, 2012

(65) Prior Publication Data
US 2014/0070844 A1 Mar. 13, 2014

(30) Foreign Application Priority Data
Jan. 19, 2011 (FR) ...................... 11 50402

(51) Int. Cl.
G11C 11/00 (2006.01)
G11C 13/00 (2006.01)
(Continued)

(52) U.S. Cl.
CPC ............ *G11C 13/0069* (2013.01); *G11C 11/15* (2013.01); *G11C 11/16* (2013.01); *G11C 11/412* (2013.01); *G11C 13/0002* (2013.01); *H03K 19/017581* (2013.01)

(58) Field of Classification Search
USPC ........................................ 365/154, 158, 171
See application file for complete search history.

(56) References Cited

U.S. PATENT DOCUMENTS 4,006,469 A  2/1977  Leehan et al.
5,973,965 A  10/1999  Berthold et al.
(Continued)

FOREIGN PATENT DOCUMENTS

EP  1134746 A2  9/2001
FR  2966636 A1  4/2012
(Continued)

OTHER PUBLICATIONS

Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.
(Continued)

*Primary Examiner* — Vu Le
(74) *Attorney, Agent, or Firm* — Kaplan Breyer Schwarz & Ottesen LLP

(57) ABSTRACT

The invention concerns a memory device comprising at least one memory cell comprising: a first transistor (102) coupled between a first storage node (106) and a first resistance switching element (202) programmed to have a first resistance; and a second transistor (104) coupled between a second storage node (108) and a second resistance switching element (204) programmed to have a second resistance, a control terminal of said first transistor being coupled to said second storage node, and a control terminal of said second transistor being coupled to said first storage node; and control circuitry (602) adapted to store a data value ($D_{NV}$) at said first and second storage nodes by coupling said first and second storage nodes to a first supply voltage ($V_{DD}$, GND), the data value being determined by the relative resistances of the first and second resistance switching elements.

16 Claims, 4 Drawing Sheets

(51) Int. Cl.
  *G11C 11/15* (2006.01)
  *G11C 11/16* (2006.01)
  *G11C 11/412* (2006.01)
  *H03K 19/0175* (2006.01)

(56) References Cited

U.S. PATENT DOCUMENTS

| | | | |
|---|---|---|---|
| 6,172,899 B1 | 1/2001 | Marr et al. | |
| 6,717,844 B1 * | 4/2004 | Ohtani | 365/158 |
| 7,495,945 B2 | 2/2009 | Roehr | |
| 7,760,538 B1 | 7/2010 | Paak | |
| 7,764,081 B1 | 7/2010 | Tuan et al. | |
| 7,796,417 B1 | 9/2010 | Lewis | |
| 8,154,916 B2 * | 4/2012 | Sugiyama et al. | 365/171 |
| 8,508,983 B2 | 8/2013 | Wang et al. | |
| 8,605,490 B2 | 12/2013 | Fackenthal | |
| 8,773,896 B2 | 7/2014 | Shukh | |
| 2003/0161184 A1 | 8/2003 | Lee et al. | |
| 2003/0204689 A1 | 10/2003 | Shimoda | |
| 2004/0125643 A1 | 7/2004 | Kang et al. | |
| 2004/0141363 A1 | 7/2004 | Ohtsuka et al. | |
| 2005/0128791 A1 * | 6/2005 | Kang | 365/154 |
| 2006/0181916 A1 | 8/2006 | Roehr | |
| 2007/0041242 A1 * | 2/2007 | Okazaki et al. | 365/154 |
| 2008/0089146 A1 | 4/2008 | Fujito et al. | |
| 2009/0109734 A1 | 4/2009 | Hanafi | |
| 2009/0190409 A1 | 7/2009 | Dittrich et al. | |
| 2009/0268513 A1 | 10/2009 | De Ambroggi et al. | |
| 2010/0080042 A1 | 4/2010 | Lamorey | |
| 2010/0188891 A1 | 7/2010 | Taniguchi et al. | |
| 2010/0202191 A1 | 8/2010 | Ahn et al. | |
| 2010/0208512 A1 * | 8/2010 | Ueda | 365/148 |
| 2010/0259975 A1 | 10/2010 | Toda | |
| 2010/0271866 A1 | 10/2010 | Sakimura et al. | |
| 2011/0085372 A1 | 4/2011 | Fackenthal | |
| 2011/0095255 A1 | 4/2011 | Sumino et al. | |
| 2011/0110142 A1 | 5/2011 | Kitagawa et al. | |
| 2011/0122709 A1 | 5/2011 | Kim et al. | |
| 2011/0208904 A1 | 8/2011 | Fujito et al. | |
| 2012/0001672 A1 | 1/2012 | Barrow | |
| 2013/0135008 A1 | 5/2013 | Zhang et al. | |
| 2014/0043062 A1 | 2/2014 | Guillemenet et al. | |
| 2014/0050012 A1 | 2/2014 | Guillemenet et al. | |
| 2014/0078810 A1 | 3/2014 | Prenat et al. | |
| 2014/0167816 A1 | 6/2014 | Guillemenet et al. | |
| 2014/0269003 A1 | 9/2014 | Guillemenet et al. | |
| 2015/0009744 A1 | 1/2015 | Di Pendina et al. | |

FOREIGN PATENT DOCUMENTS

| | | |
|---|---|---|
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |
| WO | 2012098181 A1 | 7/2012 |

OTHER PUBLICATIONS

Damien Czarik, "Related International Patent Application No. PCT/EP2012/050767", "International Search Report", May 7, 2012, Publisher: EPO, Published in: EP.
"International Search Report", dated Jul. 19, 2013, issued in releated International Application No. PCT/FR2013/050910 (counterpart to related U.S. Appl. No. 14/395,555).
"International Preliminary Report on Patentability", dated Jul. 23, 2013, issued in related International Application No. PCT/EP2012/050800 (counterpart to related U.S. Appl. No. 13/980,529).
Damien Czarik, "International Search Report"; dated May 7, 2012, issued in related International Patent Application No. PCT/EP2012/050800 (counterpart to related U.S. Appl. No. 13/980,529).
Dylan C. White, "Non-Final Office Action"; dated Dec. 29, 2014, issued in related U.S. Appl. No. 13/980,529.
"Final Office Action"; issued in related U.S. Appl. No. 13/980,529 on Apr. 30, 2015.
"International Preliminary Report on Patentability", dated Jul. 23, 2013, issued in related International Application No. PCT/EP2012/050798 (counterpart to related U.S. Appl. No. 13/980,555).
Damien Czarik, "International Search Report", dated Feb. 29, 2012, issued in related International Patent Application No. PCT/EP2012/050798 (counterpart to related U.S. Appl. No. 13/980,555).
"Office Action" issued in related U.S. Appl. No. 13/980,555 on Apr. 28, 2015.
"International Preliminary Report on Patentability" dated Jul. 23, 2013, issued in related International Application No. PCT/EP2012/050772 (counterpart to related U.S. Appl. No. 13/980,558).
"International Search Report", dated Jul. 12, 2012, issued in related International Patent Application No. PCT/EP2012/050772.
Tan Nguyen, "Supplemental Notice of Allowance", dated Jan. 21, 2015, issued in related U.S. Appl. No. 13/980,558.
"Supplemental Notice of Allowance", dated Dec. 4, 2014, issued in related U.S. Appl. No. 13/980,558.
Nguyen, Tan, "Notice of Allowance", dated Sep. 26, 2014, issued in related U.S. Appl. No. 13/980,558.
"International Preliminary Report on Patentability", dated Jul. 23, 2013, issued in related International Application No. PCT/EP2012/050767 (counterpart to related U.S. Appl. No. 13/980,559).
"International Search Report", dated May 7, 2012, issued in related International Patent Application No. PCT/EP2012/050767 (counterpart to related U.S. Appl. No. 13/980,559).
"International Preliminary Report on Patentability", dated Dec. 17, 2013, issued in related International Application No. PCT/EP2012/061267.
"Supplmental Notice of Allowance", dated Feb. 9, 2015, issued in related U.S. Appl. No. 14/126,051.
"Supplemental Notice of Allowance", dated Feb. 20, 2015, issued in related U.S. Appl. No. 14/126,051.
"Notice of Allowance" issued in related U.S. Appl. No. 14/126,051 on Sep. 26, 2014.
"Supplemental Notice of Allowance", dated Jan. 2, 2015, issued in related U.S. Appl. No. 14/126,051.
Officer: Agnes Wittmann-Regis, "International Preliminary Report on Patentability" dated Dec. 17, 2012, issued in related International Patent Application No. PCT/EP2012/061268 (counterpart to related U.S. Appl. No. 14/126,067).
"Notice of Allowance", dated Apr. 17, 2015, issued in related U.S. Appl. No. 14/126,067.
"NonFinal Office Action", dated Oct. 8, 2014, issued in related U.S. Appl. No. 14/126,067.
Balaguer Lopez, J., "European Search Report", dated Nov. 13, 2014, issued in related EP Application No. 14175842.5 (counterpart to related U.S. Appl. No. 14/324,110).
Balaguer Lopez, J., "French Search Report", dated Mar. 7, 2014, for related French Patent Application No. 13/56637, which corresponds to related U.S. Appl. No. 14/324,110.
G. Grynkewich et al, "Nonvolatile Magnetoresistive Random-Access Memory Based on Magnetic Tunnel Junctions", MRS Bulletin; Nov. 2014, pp. 818-821; Publisher: www.mrs.org/publications/bulletin; XP007901070.
"NonFinal Office Action" issued in related U.S. Appl. No. 14/324,110, Jul. 28, 2015, Publisher: USPTO, Published in: US.
Guillaume et al, "Related U.S. Appl. No. 14/395,555, filed Oct. 20, 2014".
Yue Zhang et al, "Compact Modeling of Perpendicular-Anisotrophy CoFeB/MgO Magnetic Tunnel Junctions", Mar. 2012, pp. 819-826, vol. 59, No. 3.
Lionel Torres et al., "Evaluation of hybrid MRAM/CMOS cells for reconfigurable computing" Published in: FR.
Luqiao Liu, et al, "Magnetic switching by spin torque from the spin Hall effect" Published in: US.
Saied Tehrani, et al, "Magnetoresistive Random Access Memory Using Magnetic Tunnel Junctions", "Proceedings of the IEEE", May 2003, pp. 703-714, vol. 91, No. 5.

(56) References Cited

OTHER PUBLICATIONS

Ioan Mihai Miron et al, "Perpendicular switching of a single ferromagnetic layer induced by in-plane current injection", "Nature; DOI: 10.1038/nature10309.11", Aug. 11, 2011, pp. 189-194, vol. 476, Publisher: Macmillan Publishers Limited.

L. Q. Liu et al., "Spin-Torque Switching with the Giant Spin Hall Effect of Tantalum", 2012, vol. 336, No. 555.

I L Prejbeanu et al., "Thermally assisted MRAM", "Journal of Physics: Condensed Matter", Apr. 6, 2007, pp. 23, Publisher: IOP Publishing, Published in: UK.

Sasikanth Manipatruni et al, "Voltage and Energy-Delay Performance of Giant Spin Hall Effect Switching for Magnetic Memory and Logic", pp. 1-16.

IBM, "Combined Single/Dual-Port Array Approach with 6-Device Cell", "IBM Technical Disclosure Bulletin", Jun. 1, 1988, pp. 291-292, vol. 31, No. 1, Publisher: IBM Corp., Published in: US.

Yamamoto, et al, "Nonvolatile Static Random Access Memory Using Resistive Switching Devices: Variable-Transconductance Metal Oxide Semiconductor Field-Effect-Transistor Approach", "Japanese Journal of Applied Physics", Apr. 1, 2010, pp. 40209-1, vol. 49, No. 4, Publisher: Japan Society of Applied Physics, Published in: JP.

Yoann Guillemenet et al, "A Non-Volatile Run-Time FPGA Using Thermally Assisted Switching MRAMS", pp. 421-426.

William C. Black, Jr., et al., "Programmable logic using giant-magnetoresistance and spin-dependent tunneling devices (invited)"; "Journal of Applied Physics"; Publisher: AIP Publishing; http://dx.doi.org/10.1063/1.372806; vol. 37; No. 9; pp. 6674-6679.

\* cited by examiner

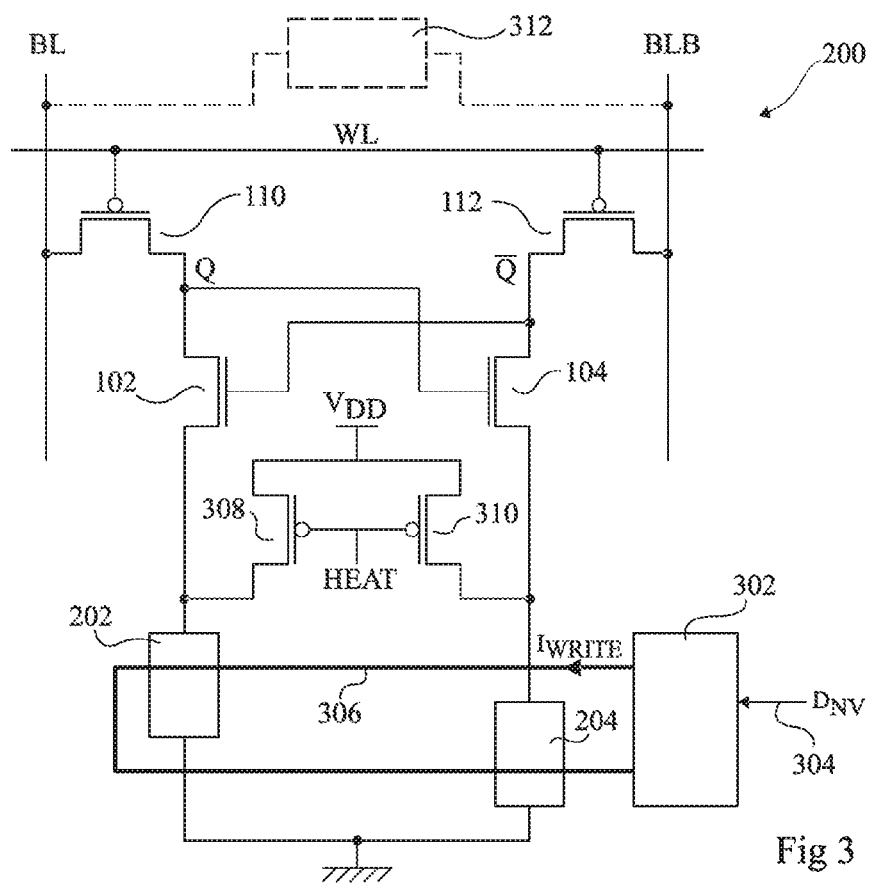
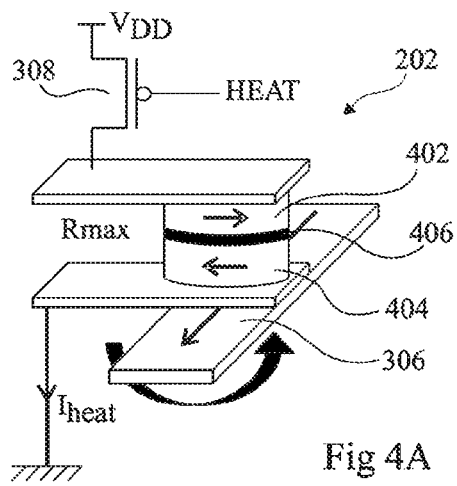
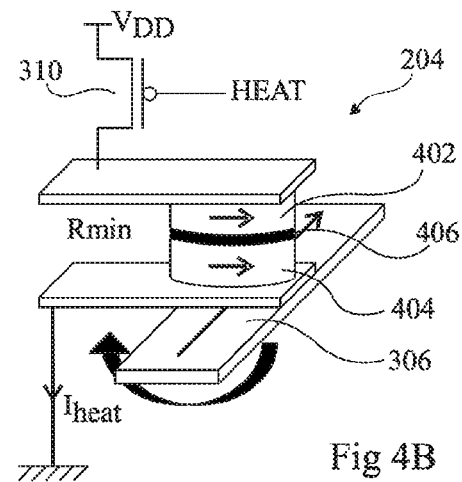
Fig 4A    Fig 4B
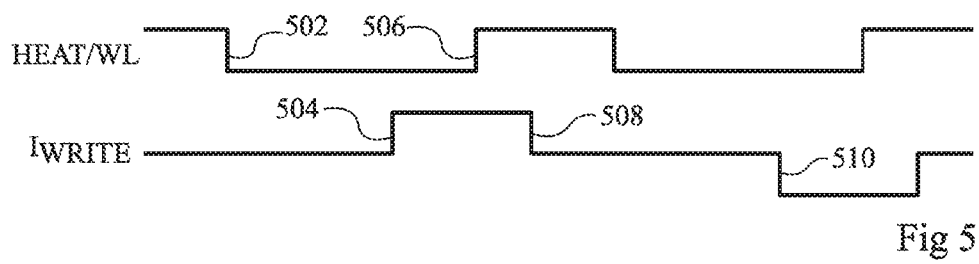
Fig 5

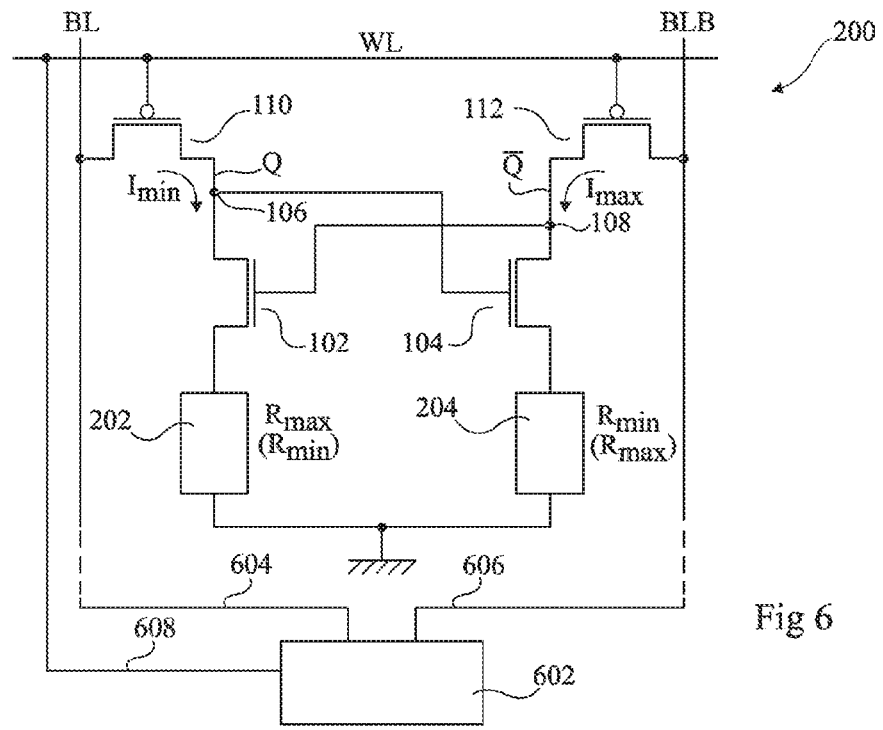
Fig 6
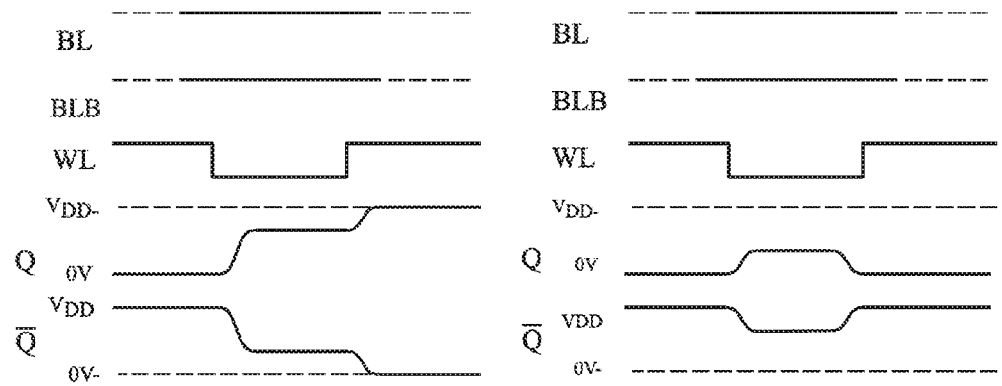
Fig 7A
Fig 7B
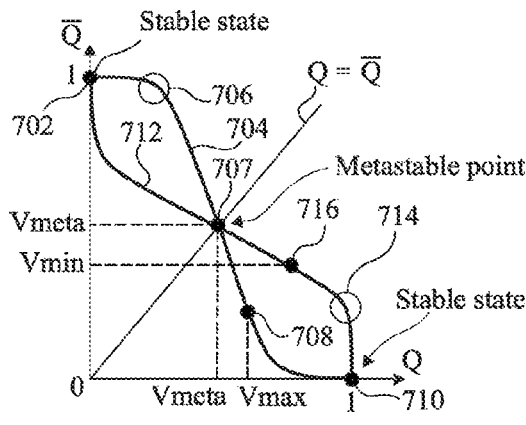
Fig 7C
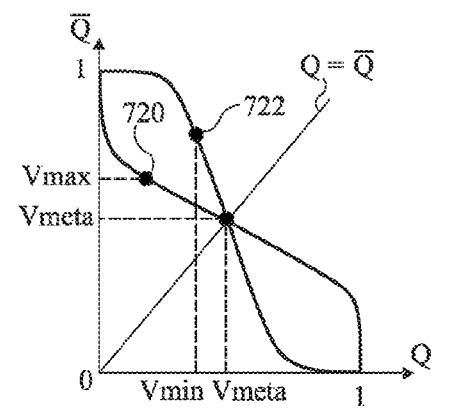
Fig 7D

VOLATILE/NON-VOLATILE MEMORY CELL

FIELD OF THE INVENTION

The present invention relates to a programmable volatile/non-volatile memory cell, and to a method of reading a programmable non-volatile memory cell.

BACKGROUND OF THE INVENTION

FIG. 1 illustrates a typical static random access memory (SRAM) cell 100. A first inverter is formed of an N-channel MOS (NMOS) transistor 102 and P-channel MOS (PMOS) transistor 103 coupled in series between a supply voltage $V_{DD}$ and a ground voltage. A second inverter is formed of an NMOS transistor 104 and a PMOS transistor 105 also coupled in series between the supply voltage $V_{DD}$ and the ground voltage. The gates of transistors 104 and 105 are coupled to a node 106 coupled to the drains of transistors 102 and 103, while the gates of transistors 102 and 103 are coupled to a node 108 coupled to the drains of transistors 104 and 105, such that the inverters form a latch.

The nodes 106 and 108 store complementary voltage states Q and $\overline{Q}$, permitting one bit of data to be memorized by the cell. Node 106 is coupled to a bit line BL via a P-channel MOS (PMOS) transistor 110, while node 108 is coupled to a complementary bit line BLB via a PMOS transistor 112. The gates of transistors 110 and 112 are coupled to a word line WL, and are activated by a low signal allowing data to be written to or read from the cell 100.

The circuit 100 has advantage of being relatively quick to access during read and write operations. However, a disadvantage is that, as with all volatile memory cells, the stored data is lost if the supply voltage $V_{DD}$ is removed.

Flash memory is an example of a programmable non-volatile memory. A disadvantage with flash memory is that it is relatively slow to access when compared to the SRAM cell of FIG. 1, and requires a relatively high supply voltage. Furthermore, the Flash technology is difficult to integrate with CMOS, and has relatively low endurance.

In many applications there is a need for a programmable memory cell capable of storing non-volatile data, and having increased access speeds.

SUMMARY OF THE INVENTION

It is an aim of embodiments of the present invention to at least partially address one or more needs in the prior art.

According to one aspect of the present invention, there is provided a memory device comprising: at least one memory cell comprising: a first transistor coupled between a first storage node and a first resistance switching element programmed to have a first resistance; and a second transistor coupled between a second storage node and a second resistance switching element programmed to have a second resistance, a control terminal of said first transistor being coupled to said second storage node, and a control terminal of said second transistor being coupled to said first storage node; and control circuitry adapted to store a data value at said first and second storage nodes by coupling said first and second storage nodes to a first supply voltage, the data value being determined by the relative resistances of the first and second resistance switching elements. For example, the first transistor is connected by its main current terminals between the first storage node and the first resistance switching element, and the second transistor is connected by its main current terminals between the second storage node and the second resistance switching element.

According to one embodiment, the control circuitry is further adapted to isolate said first and second storage nodes from said first supply voltage after a time delay.

According to another embodiment, memory cell further comprises a third transistor coupled between said first storage node and a first access line; and a fourth transistor coupled between said second storage node and a second access line, wherein said control circuitry is adapted to control said third and fourth transistors to connect said first and second storage nodes to said first and second access lines respectively.

According to another embodiment, the third and fourth transistors are adapted to have a lower threshold voltage than said first and second transistors.

According to another embodiment, said control circuitry is adapted to couple said first and second access lines to a second supply voltage during a standby phase prior to storing said data value at said first and second storage nodes.

According to another embodiment, the first and second resistance switching elements are respectively coupled between said first and second transistors and the second supply voltage. For example, the first resistance switching element comprises a first terminal connected to a main current terminal of the first transistor and a second terminal connected to the second supply voltage, and the second resistance switching element comprises a first terminal connected to a main current terminal of the second transistor and a second terminal connected to the second supply voltage.

According to another embodiment, the memory device further comprises programming circuitry adapted to program the resistances of said first and second resistance switching elements based on input data.

According to another embodiment, the first and second resistance switching elements are one of: oxide resistive elements; conductive bridging elements; phase change elements; programmable metallization elements; spin-torque-transfer elements; and field-induced magnetic switching elements.

According to another embodiment, the first and second resistance switching elements are thermally assisted switching elements, the memory device further comprising heating circuitry arranged to heat said first and second resistance switching elements by passing a current through them.

According to another embodiment, the heating circuitry is adapted to couple a third supply voltage to said first and second storage nodes.

According to another embodiment, the first transistor is the only transistor of a first inverter of said at least one memory cell, and the second transistor is the only transistor of a second inverter of said at least one memory cell.

According to another aspect of the present invention, there is provided a random access memory comprising an array of the above memory devices.

According to another aspect of the present invention, there is provided a field programmable gate array comprising at least one multiplexer comprising an input coupled to at least one of the above memory devices.

According to another aspect of the present invention, there is provided a field programmable gate array comprising: a plurality of configurable logic blocks; and at least one switching block adapted to interconnect said plurality of configurable logic blocks, wherein said at least one switching block comprises the above memory device.

According to another aspect of the present invention, there is provided a method of transferring a data value from nonvolatile storage of a memory cell to first and second volatile storage nodes of said memory cell, wherein the memory cell comprises a first transistor coupled between said first storage node and a first resistance switching element programmed to have a first resistance; and a second transistor coupled between said second storage node and a second resistance switching element programmed to have a second resistance, a control terminal of said first transistor being coupled to said second storage node, and a control terminal of said second transistor being coupled to said first storage node, the method comprising: coupling said first and second storage nodes to a first supply voltage, the data value being determined by the relative resistances of the first and second resistance switching elements.

According to one embodiment, the method further comprises, a first time period after coupling said first and second storage nodes to said first supply voltage, the step of isolating said first and second storage nodes from said first supply voltage.

According to another embodiment, coupling said first and second storage nodes to said first supply voltage comprises activating a third transistor coupled between said first storage node and said first supply voltage, and activating a fourth transistor coupled between said second storage node and said first supply voltage.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 3 illustrates programming circuitry for programming the non-volatile portion of the memory cell of FIG. 2;

FIGS. 4A and 4B schematically represent examples of the programming of a specific resistance switching memory device;

FIG. 5 is a timing diagram illustrating an example of the signals used for programming the non-volatile portion of the memory cell of FIG. 3;

FIG. 6 illustrates an example of control circuitry for copying data stored by non-volatile data storage elements to volatile data storage elements of the memory cell;

FIGS. 7A and 7B are timing diagrams showing examples of signals in the circuitry of FIG. 6;

FIGS. 7C and 7D are graphs illustrating the transition between stable states of the cell of FIG. 6 according to one example;

Throughout the figures, like features have been labelled with like reference numerals.

DETAILED DESCRIPTION OF EMBODIMENTS
OF THE PRESENT INVENTION

Only those features useful for an understanding of the invention have been illustrated in the figures and will be described in detail in the following. Other aspects, such as the particular applications of the memory cell, have not been described, the memory cell being suitable for use in a wide range of applications.

Figure 2:
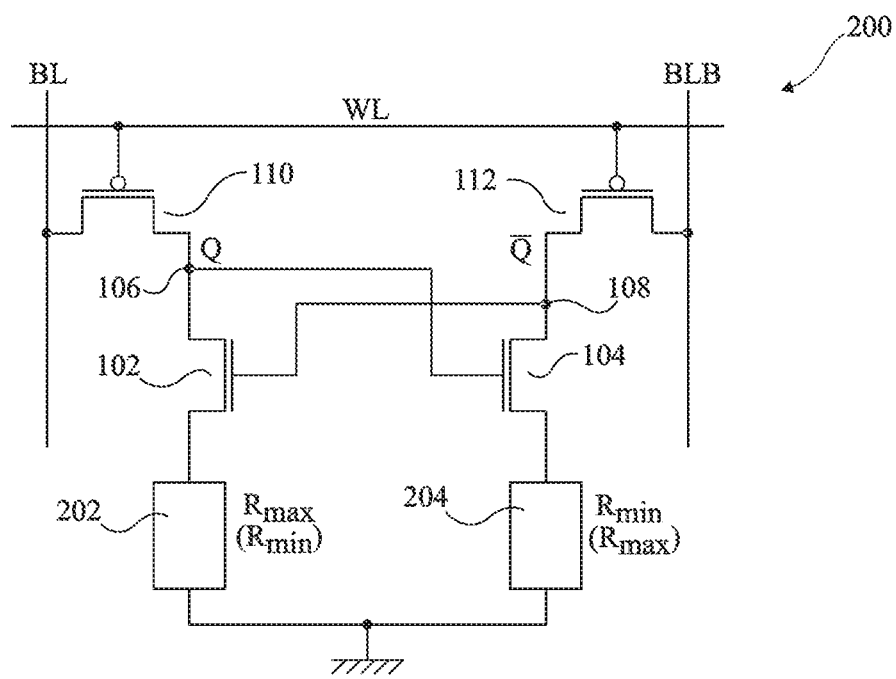
FIG. 2 illustrates a memory cell with non-volatile data storage according to an embodiment of the present invention.

FIG. 2 illustrates a memory cell 200 that stores, in addition to one bit of volatile data, one bit of non-volatile data. The volatile data is stored in electronic form by a latch. The non-volatile data however is stored by the physical state of a pair of resistance switching elements, as will now be described.

Figure 1:
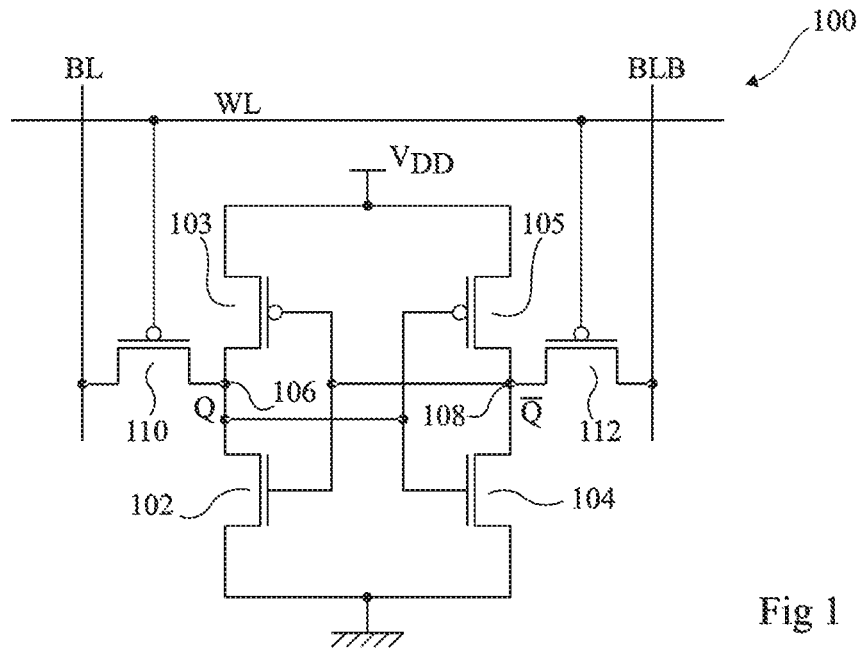
FIG. 1 (described above) illustrates a volatile SRAM cell.

The memory cell 200 is similar to the SRAM cell 100 of FIG. 1 described above, and the common portions will not be described again in detail. However, rather than comprising six transistors, the memory cell 200 comprises just four transistors. Indeed, the PMOS transistors 103 and 105 forming half of each inverter are removed, and thus there is no connection to the supply voltage $V_{DD}$ in memory cell 200. Furthermore, the memory cell 200 additionally comprises resistance switching elements 202 and 204, which are coupled between the respective sources of transistors 102 and 104 and the ground voltage.

The resistance switching elements 202 and 204 are any resistive elements switchable between two resistance values. Such elements maintain the programmed resistive state even after a supply voltage is removed. The resistance switching elements 202, 204 are programmed to have opposite values, and the relative values of the elements indicate one binary data value.

For example, the resistance switching elements 202, 204 are based on magnetic tunnelling junctions (MTJs), such as field-induced magnetic switching (FIMS) elements, thermally assisted switching (TAS) elements, STT (spin-torque-transfer) elements, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching elements 202, 204 could be other types of resistance switching memory devices, including those used in programmable metallization cells (PMC), such as oxide resistive RAM (OxRRAM), conductive bridging RAM (CBRAM), or phase change RAM (PCRAM).

Whatever the type of resistance switching element, information is stored by setting one of the elements at a relatively high resistance ($R_{max}$), and the other at a relatively low resistance ($R_{min}$). Each of the resistance switching elements 202, 204 for example has just two resistive states corresponding to the high and low resistances $R_{max}$ and $R_{min}$, although the exact values of $R_{min}$ and $R_{max}$ may vary depending on conditions such as temperature, process variations etc. The non-volatile data value represented by the resistive elements 202, 204 depends on which of the resistive elements is at the resistance $R_{max}$ and $R_{min}$, in other words on the relative resistances. The resistance elements 202, 204 are for example selected such that $R_{max}$ is always significantly greater than $R_{min}$, for example at least 20 percent greater. In general, the ratio between the resistance $R_{max}$ and the resistance $R_{min}$ is for example between 1.7 and 5 for an MRAM, or more generally between 1.2 and 10000. In one example, $R_{min}$ is in the region of 2.5 k ohms, and $R_{max}$ is in the region of 5 k ohms, although many other values are possible.

In the SRAM cell 100 of FIG. 1, transistors 103 and 105 are coupled to the supply rail $V_{DD}$ and perform the role of maintaining the high state of Q or $\overline{Q}$ at node 106 or 108 when the cell is in standby between write and read operations. In the cell 200 of FIG. 2, in which these transistors have been removed, the high state of Q or $\overline{Q}$ is maintained by leakage current passing through the PMOS transistor 110 or 112, from the corresponding bit line BL or BLB. For example, the bit lines BL and BLB are charged to the supply voltage $V_{DD}$ at least periodically during the standby state, to generate the leakage current.

The threshold voltages of the PMOS transistors 110, 112 are lower than those of NMOS transistors 102, 104, such that when in the non-conducting state, the current leakage through transistors 110 and 112 is greater than through transistor 102 or 104, thereby keeping the corresponding node 106 or 108 at a voltage high enough to be seen as a high logic level. In other words, the leakage current $I_{offP}$ flowing through PMOS transistor 110 or 112 when a high voltage is applied to its gate node is greater that the leakage current $I_{offN}$ flowing through the corresponding NMOS transistor 102 or 104 when a low voltage is applied to its gate node. The particular threshold voltages will depend on the technology used. But as an example, the threshold voltages of PMOS transistors 110, 112 are chosen to be in the range 0.3 to 0.5 V, while the threshold voltages of NMOS transistors 102, 104 are in the range 0.4 to 0.6 V. In any case, the ratio $I_{OffP}/I_{Offn}$ is selected for example to be greater than 25, and preferably greater than 100.

In operation, for reading and writing data to the volatile portion of the memory cell 200, in other words to the storage nodes 106 and 108, the process is the same as for the memory cell 100, and is not affected by the programmed resistance values of the resistance switching elements 202 and 204. Briefly, writing a bit of data to nodes 106, 108 involves applying, while transistors 110 and 112 are turned on, a high or low voltage to bit line BL depending on the data to be stored, and the opposite voltage to bit line BLB. Reading the data from nodes 106 and 108 involves pre-charging the bit lines BL and BLB, and then turning on transistors 110 and 112 and determining which bit line voltage drops first, with the aid of a sense amplifier (not illustrated), which amplifies the voltage difference between the bit lines. Preferably, so as not to slow the read and write operations to the volatile storage nodes and to prevent a bit-flip during a read operation, the value of $R_{max}$ is chosen not to be greater than around 5 k ohms, although this value will depend on the particular technology used, and in particular the on resistance of the transistors.

Independently of this normal SRAM operation, the resistance switching elements may be programmed to store non-volatile data, and the memory cell may be controlled to transfer this data, from physical storage determined by the resistive states of elements 202, 204, to electronic storage determined by the voltage states of the storage nodes 106, 108. Once transferred, this data may be read from the SRAM cell in a standard fashion.

Programming of the resistance switching elements 202 and 204 according to one example will now be described with reference to FIGS. 3, 4A, 4B and 5.

FIG. 3 illustrates the memory cell 200 along with write control circuitry 302 arranged to program the resistance switching elements 202 and 204 based on one bit of non-volatile data $D_{NV}$ received on an input line 304. In particular, based on the non-volatile data $D_{NV}$, the circuitry 302 generates a write current $I_{WRITE}$, which is provided on a conductive track 306 that passes by the resistance switching elements 202 and 204. The current $I_{WRITE}$ flowing through the conductive track 306 generates a magnetic field, which passes through the resistance switching elements, and programs their resistive state.

In the case of thermally assisted switching MRAM, prior to supplying the write current to program each of the resistance switching elements 202, 204, the resistance switching elements are heated by passing a current through them, which aids the transition from one resistive state to another.

According to one example illustrated in FIG. 3, heating circuitry is provided that comprises PMOS transistors 308 and 310 coupled between the supply voltage $V_{DD}$ and the resistance switching elements 202, 204 respectively. The transistors 308 and 310 are activated by a control signal "HEAT" at their gate terminals to conduct currents that passes through each resistance switching element 202, 204.

Alternatively or additionally, heat control circuitry 312 is for example provided, which applies to each of the bit lines BL and BLB a voltage, for example equal to or greater than the supply voltage $V_{DD}$. Then, by activating the transistors 110 and 112, a current will flow from the bit lines BL and BLB through the corresponding resistance switching elements 202, 204 to the ground voltage.

FIGS. 4A and 4B show the resistance switching elements 202, 204 in more detail in the example that they are TAS elements. Each of the resistance switching elements 202, 204 comprises a pinned ferromagnetic plate 402 and a free ferromagnetic plate 404, plates 402 and 404 sandwiching a tunnel oxide layer 406. The conductive track 306 passes close to the free plate 404 of ferromagnetic material, such that it is affected by the magnetic field generated by the current $I_{WRITE}$ flowing through track 306. The pinned plate 402 for example has a magnetic orientation in a first direction, while the magnetic orientation of plate 404 may be programmed, by the polarity of the current $I_{WRITE}$, to be in the same or opposite direction to that of plate 402. However, programming only occurs in elements that have already been heated, as described in more detail below.

FIG. 4A illustrates the case in which the magnetic orientations are in opposite directions in the plates 402, 404, resulting in a maximum resistance $R_{max}$ of the resistance switching element 202, for example in the range 2 k to 5 k Ohms.

FIG. 4B illustrates the case in which the magnetic orientations are in a same direction in the plates 402 and 404, resulting in a minimum resistance $R_{min}$ of the resistance switching element 204, for example in the range of 100 to 3 k Ohms.

The conductive track 306 is arranged such that the current $I_{WRITE}$ passes by each resistance switching element 202, 204 in opposite directions, one of which corresponds to the magnetic orientation of the pinned plate 402, and the other being the opposite orientation. Thus, a same current $I_{WRITE}$ can be used to program both the resistive states of the resistance switching element 202 and 204 at the same time, one of which is equal to $R_{max}$, and the other to $R_{min}$.

FIG. 5 is a timing diagram illustrating an example of the signals HEAT and/or WL, depending on whether the transistors 308, 310 and/or circuitry 312 are present, and the signal $I_{WRITE}$ during the programming of the resistance switching elements 202, 204.

The signals HEAT and/or WL fall low at falling edge 502, thereby activating the transistors 308 and 310 and/or the transistors 110 and 112. This generates a current $I_{HEAT}$ through the resistance switching elements 202 and 204, and after a certain period, the signal $I_{WRITE}$ is asserted, as shown by the rising edge 504 of this signal. In the example of FIG. 5, at rising edge 504 the current becomes positive, which for example programs resistor 202 to be at a high resistance value $R_{max}$, and resistor 204 to be at low resistance $R_{min}$.

Next, the signals HEAT and/or WL are brought high again by rising edge 506, such that the heating current $I_{HEAT}$ is stopped, and the resistance switching elements 202, 204 cool in their current resistive state. Then the signal $I_{WRITE}$ is brought low by a falling edge 508, to end the programming process.

The subsequent transitions of the signals in FIG. 5 correspond to the programming of opposite resistive states of the resistive elements 202, 204. These transitions are identical to those previously described, except that the signal $I_{WRITE}$ becomes negative by falling edge 510, rather than positive, to program the opposite resistive states.

In one example, the time during which the signals HEAT and/or WL are active between edges 502 and 506 is around 20 ns. Thus a write operation can be achieved in little more than 35 ns. However, the heating and cooling-off times will vary based on factors such as the materials used, their volumes, etc., and also the heat currents that are applied, and thus the above values are given only as approximate examples.

The current $I_{WRITE}$ is for example in the region of 10 mA for programming one value of the data bit, or in the region of −10 mA for programming the opposite value of the data bit, although other values could be used.

FIG. 6 illustrates the memory cell 200 along with transfer control circuitry 602, for controlling the transfer of data stored in the non-volatile portion of the memory cell to the volatile data storage portion. In particular, the circuitry 602 comprises output lines 604 and 606 coupled to bit lines BL and BLB respectively, and an output line 608 coupled to the word line WL.

The signals on the word line WL and bit lines BL, BLB during a non-volatile to volatile transfer phase will now be described with reference to FIGS. 7A and 7B.

In general, the transfer phase comprises applying by the control circuitry 602 a supply voltage to each of the storage nodes 106, 108, via the bit lines BL and BLB. This generates a current through each of the resistance switching elements 202, 204, such that the voltages at nodes 106, 108 will depend on the relative resistances of the elements 202, 204.

FIG. 7A shows timing diagrams illustrating the voltages on the bit lines BL and BLB, as well as on the word line WL, and the corresponding voltages Q and $\overline{Q}$ at the storage nodes 106 and 108.

Initially, the circuitry 602 applies a high voltage to each of the bit lines BL, BLB, for example at the supply voltage $V_{DD}$. The bit lines BL and BLB are likely to be close to or at the supply voltage $V_{DD}$ during a standby or read phase prior to the transfer phase, but during such phases they are generally only periodically charged to the supply voltage, and for this reason the voltages of BL and BLB prior to and after the transfer phase have been indicated by dashed lines in FIG. 7A. On the contrary, during the transfer phase, the supply voltage is constantly applied to the bit lines BL, BLB, as indicated by solid lines in FIG. 7A, such that currents may be drawn from the bit lines.

Then, the word line voltage WL is brought low, to activate the transistors 110 and 112.

FIG. 7A assumes that the SRAM cell is initially in a state in which Q is low and $\overline{Q}$ is high. Thus initially, transistor 104 will be non-conducting, and transistor 102 conducting. However, it is also assumed that resistance switching element 202 has a resistance $R_{max}$, and thus the current flowing through it will be limited. This current causes the voltage Q to rise towards $V_{DD}$, which in turn activates transistor 104, causing a second current to flow through resistor 204, which has a low resistance $R_{min}$. This will also reduce the voltage $\overline{Q}$ towards 0 V. The PMOS transistors 110, 112 are chosen to have equal dimensions and thus very similar off resistances, such that the voltage drop across each transistor 110, 112 will be proportional to the current level flowing through it. Thus, the lower voltage drop across transistor 110 will cause a higher voltage Q at node 106. Thus due to the difference in the resistances of resistive elements 202 and 204, the equilibrium position will be that the voltage Q at node 106 is closer to $V_{DD}$, and the voltage Q at node 108 will be closer to 0 V. Then, the word line voltage goes high, isolating the storage nodes 106, 108 from bit lines BL and BLB, and the states of Q and $\overline{Q}$ will settle to the closest stable state. In particular, due to the voltage difference, even if small, between the voltages Q and $\overline{Q}$, the storage nodes 106, 108 will settle to a state in which Q is high and $\overline{Q}$ is low, which corresponds to the state stored by the elements 202 and 204.

FIG. 7B illustrates the case in which Q and $\overline{Q}$ are again initially equal to 0 V and $V_{DD}$ respectively, but in which element 202 is at $R_{min}$, and element 204 at $R_{max}$. In this case, transistor 102 will initially still be conducting, and transistor 104 non-conducting, but again the voltage at node 106 will rise due to the current flowing through the resistance switching element 202. However, when the current through element 204 starts to rise, it will be a low current due to the high resistance of element 204, and thus the voltage $\overline{Q}$ will stay relatively high, and the voltage Q relatively low. Then, when the word line voltage WL is brought high again, isolating the storage nodes 106, 108 from the respective bit lines, the states of storage nodes 106, 108 will settle back to their original states, in which Q is low and $\overline{Q}$ is high.

In both FIGS. 7A and 7B, the duration that the supply voltage is applied to the bit lines BL and BLB is for example in the region of 1 ns, and thus such a data transfer from the non-volatile storage to the volatile storage can be performed in approximately only 1 ns, a time comparable to the read and write times of the SRAM portion of the memory cell 200.

FIGS. 7C and 7D are graphs illustrating the transitions between different states of Q and $\overline{Q}$.

FIG. 7C illustrates the case of a transition to a high Q, low $\overline{Q}$ state. If starting from the low Q, high $\overline{Q}$ state labelled 702, as Q starts to rise, the curve 704 will be followed, in which initially $\overline{Q}$ falls slowly until a corner 706 is reached and transistor 104 starts to turn on. Then $\overline{Q}$ falls more quickly as Q rises and a point of metastability 707 is passed, at which point Q and $\overline{Q}$ are equal. Q will then reach a voltage Vmax at a point 708, resulting from the relatively large voltage drop across resistance $R_{max}$ and transistor 102. From this point 708, the closest stable state is the high Q, low $\overline{Q}$ state. Thus, when the signal WL is brought high, the high Q, low $\overline{Q}$ state, labelled 710, will be reached, $\overline{Q}$ quickly falling to logic 0, shortly before Q reaches the logic 1 state.

Alternatively, if starting from the high Q, low $\overline{Q}$ state 710, a curve 712 of FIG. 7C will be followed, in which Q will initially fall very slowly as $\overline{Q}$ rises, until a corner 714 is reached when transistor 102 starts to turn on. Q then falls more quickly to a point 716 when $\overline{Q}$ is at Vmin, resulting from the relatively small voltage drop across resistance $R_{min}$ and transistor 104. In this example, the metastability point 707 has not been crossed, and from this point 716, the closest stable state is back to the high Q, low $\overline{Q}$ state. Thus, when the signal WL is brought high, Q will quickly return to the logic 1 state, before Q drops again to the logic 0 state.

In FIG. 7D, the same curves as 7C are shown, but for the transitions to a low Q, high $\overline{Q}$ state, corresponding to an opposite magnetic state of elements 202, 204 to the example of FIG. 7C. Thus the Vmax point 720 and Vmin point 722 are both closest to the low Q, high $\overline{Q}$ state.

As demonstrated by the curves of FIGS. 7C and 7D, irrespective of the initial states of the voltages Q and $\overline{Q}$, the new states of these voltage will be determined by the programmed resistance values of elements 202 and 204. In particular, elements 202 and 204 result in an intermediate state 708, 716, 720 or 722, in which the values of Q and $\overline{Q}$ are closest to the stable state corresponding to the programmed states of elements 202, 204.

Figure 8:
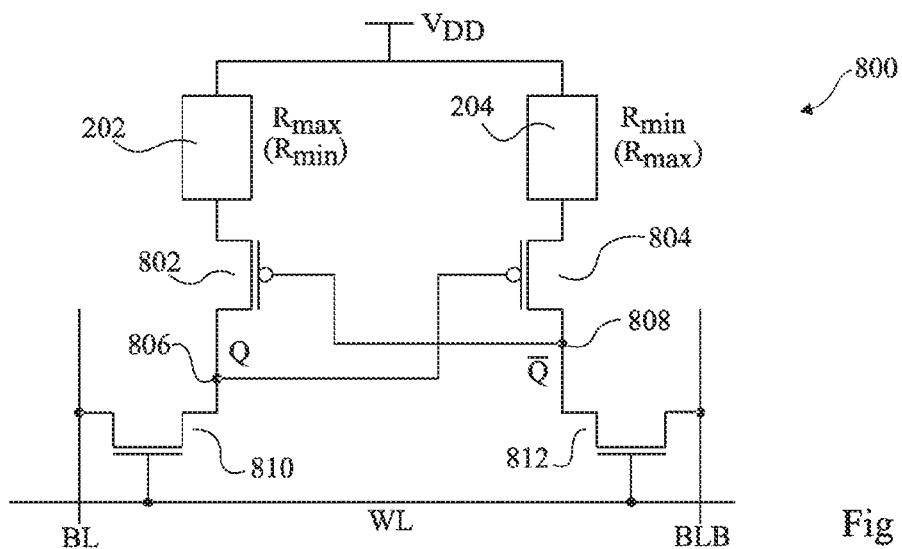
FIG. 8 illustrates a memory cell with non-volatile data storage according to a further embodiment of the present invention.

FIG. 8 illustrates a memory cell 800, which is similar to cell 200 of FIG. 2, but in which the NMOS transistors 102, 104 are replaced by PMOS transistors 802 and 804 coupled between respective nodes 806, 808 and a supply voltage $V_{DD}$, and the PMOS transistors 110, 112 are replaced by NMOS transistors 810, 812 coupled between the respective bit lines BL and BLB and the respective nodes 806, 808. In this case, the threshold voltages of transistors 810 and 812 are lower than those of transistors 802 and 804, such that a leakage current will keep the state of the corresponding node 806 or 808 at a voltage value low enough to be seen as a logic low state during the standby phase between write operations. The resistance switching elements 202, 204 are coupled respectively between the transistors 802, 804 and the supply voltage $V_{DD}$. Furthermore, the bit lines BL and BLB are for example at least periodically brought to a low voltage during the standby phase.

The circuit 800 operates in a similar fashion to the circuit 200, except that transistors 810, 812 are activated by a high voltage level on the word line WL, and a low supply voltage, for example at 0 V, will be applied by circuitry 602 of FIG. 6 to the bit lines BL, BLB during the transfer phase from the non-volatile storage elements 202, 204 to the volatile storage nodes 806, 808, and by circuitry 312 of FIG. 3 to heat the resistance switching elements 202, 204.

Figure 9:
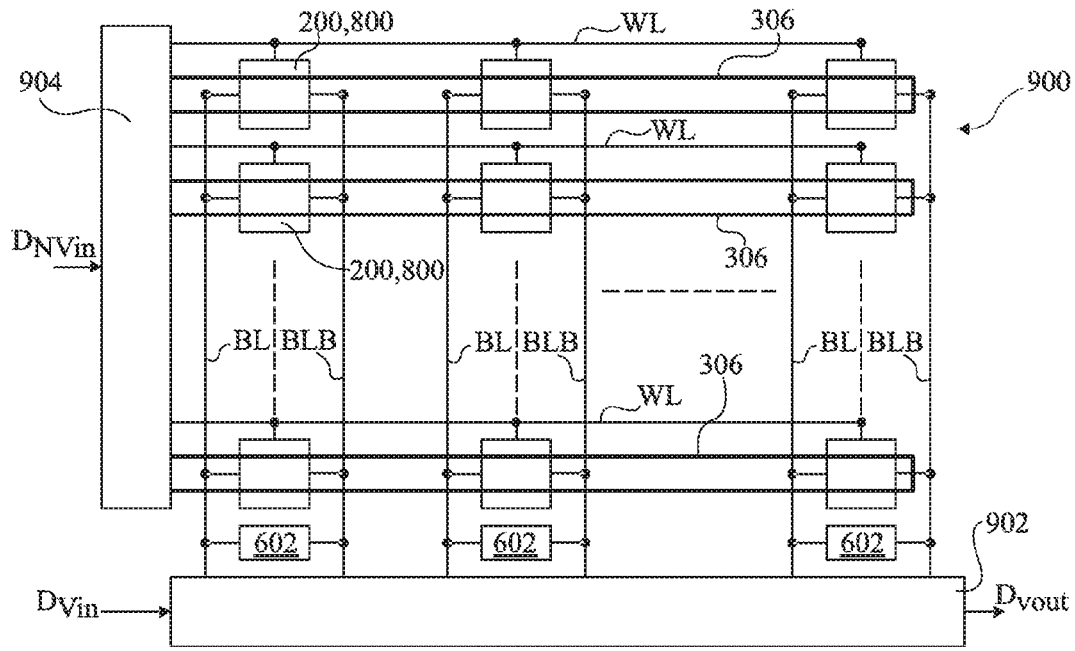
FIG. 9 illustrates a memory array according to an embodiment of the present invention.

FIG. 9 illustrates a memory array 900 of the memory cells 200 and/or 800. In this example, the memory cells 200, 800 are arranged in columns and rows, each being coupled to bit lines BL and BLB common to each of the columns. The bit lines are coupled to control circuitry 902, which for example receives volatile input data $D_{VIN}$, and volatile output data $D_{VOUT}$, which could be the externally inputted volatile data, or volatile data that is generated from a transfer of the non-volatile data stored by the resistance switching elements. The circuitry 902 for example also controls the voltages on the bit lines BL and BLB during the transfer phase, and if appropriate during the writing of non-volatile data.

Each of the cells 200, 800 is also coupled to a corresponding word line WL common to each row of cells, and a conductive track 306 forms a loop passing by each cell and conducting the current $I_{WRITE}$ for writing to the resistance switching elements of each of the memory cells. Each of the lines WL and 306 is controlled by control circuitry 904, which receives input non-volatile data $D_{NVin}$, and provides the current $I_{WRITE}$ of the corresponding polarity.

The writing of the non-volatile data is for example performed row by row, in two phases. During a first phase, only the resistance switching elements of cells for which a first logic value, such as logic "0", is to be programmed are heated. Then, when the corresponding write current is applied to the conductive track 306, the resistive states of only the elements that have been heated will be programmed. During the second phase, the resistance switching elements of the other cells, for which the second logic value, for example a logic "1", is to be programmed are heated. Then, when the corresponding write current is applied to the conductive track 306, again only the resistive states of the elements that have been heated will be programmed.

As indicated by dashed lines in FIG. 9, the memory array 900 may comprise any number of rows of cells and any number of columns of cells, depending on the desired storage capacity.

The example of FIG. 9, in which a common track 306 is used for each row of memory cells, has the advantage of being efficient in terms of energy consumption. Indeed, a single current on each track 306 can be used to program multiple memory cells of the row.

As an alternative, a common track 306 could be used for each column, which has the advantage that a row of memory cells can all be programmed in a single programming cycle. Furthermore, given that a current generator provides the current on each track 306, the number current generators would then be reduced to the number of columns rather than the number of rows of the memory.

Figures 10A, 10B:
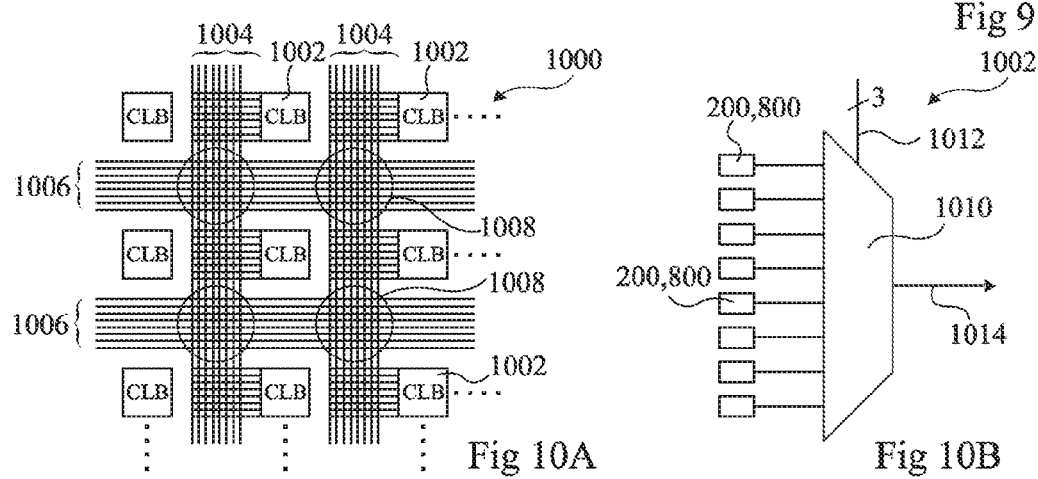
FIG. 10A illustrates a field programmable gate array (FPGA) according to an embodiment of the present invention.
FIG. 10B illustrates a configurable logic block of the FPGA of FIG. 10A in more detail according to an embodiment of the present invention.

FIG. 10A illustrates an FPGA (field programmable gate array) 1000 in which the memory cells 200 or 800 described herein may be implemented. The FPGA comprises an array of configurable logic blocks (CLB) 1002 selectively interconnected by columns of lines 1004, which in turn are selectively interconnected with rows of lines 1006. In particular, switch blocks 1008 are provided at each intersection between column lines 1004 and row lines 1006, allowing the connections between the each of the column lines 1004 with each of the row lines 1006 to be programmed. The switching blocks 1008 for example comprise one or more of the memory cells 200 or 800, allowing the connections between the lines to be programmed in a non-volatile fashion.

FIG. 10B illustrates one of the CLB 1002 in more detail according to one example in which it comprises a look-up table formed of a multiplexer 1010 having 8 data inputs, each of which is coupled to a memory cell 200 or 800 that outputs a data value from its volatile storage, i.e. one of the storage nodes 106, 108 or 806, 808. In this application, the memory cell is not coupled to bit lines of a memory array, such bit lines being coupled to multiple memory cells. Instead, they are more generally coupled to access lines, which could be bit lines, or lines coupled to just one memory cell. One of these access lines for example provides the output data value of the cell.

The multiplexer 1010 also comprises a 3-bit control input 1012, controlling which of the 8 input lines is selected, and an output line 1014, outputting the data of the selected input line.

An advantage of the embodiments of the memory cell described herein is that it is capable of storing not only one bit of volatile data, but additionally one bit of non-volatile data. Furthermore, the programmed non-volatile data can be quickly loaded to the volatile portion of the memory cell in a simple fashion, by application of a voltage to the access lines of the memory cell. This advantageously means that a state programmed in a non-volatile fashion may be quickly loaded (in less than 1 ns), for example upon activation of the memory on power-up or after a sleep period. In the case of an FPGA, this allows a circuit design to be quickly initialised, without the need of loading external data into the device to program memory latches and switches.

According to embodiments described herein, the inverters forming the memory cell are each advantageously implemented by a single transistor, each coupled to the same supply voltage. Thus the memory cell is connected to only one power rail: ground in FIG. 2; and $V_{DD}$ in FIG. 8. The volatile data stored by the memory is maintained by current leakage passing through the access transistors of the memory cell, and this leads to very little static current consumption during a standby state in which the volatile data is to be maintained. Furthermore, this volatile data can be independent of the programmed state of the resistive switching elements.

Furthermore, in the case that the volatile data in the memory is to be discarded during the standby state and only the non-volatile data is to be maintained, the power to the bit lines can be removed altogether, such that even the leakage current becomes negligible. The power consumption of the memory is thus extremely low during such a standby state.

A further advantage of the use of a single transistor for forming each inverter of the memory cell is that the difference between the resistances $R_{min}$ and $R_{max}$ of the resistance switching elements 202, 204 can be relatively low and/or the speed of the transfer of the programmed non-volatile data to the volatile portion of the memory cell can be relative quick. For example, with reference to FIG. 7C, in the case that Q is initially high and $\overline{Q}$ is initially low, the time for the voltage Q at node 106 to go from the high state at point 710 to a relatively low voltage a point 718 is relatively short, given that the voltage at node 106 will be discharged via transistor 102, and the only current charging node 106 passes through the resistance $R_{max}$, and is therefore limited. However, if on the contrary the inverter formed by transistor 102 were to comprise a second transistor coupling node 106 to $V_{DD}$ and controlled by the voltage $\overline{Q}$, there would be an additional current charging node 106 from $V_{DD}$, thus slowing the speed at which the voltage Q can fall. Thus the use of a single transistor for forming each inverter allows the difference between the resistances $R_{min}$ and $R_{max}$ to be reduced without impacting the transfer speed, or the speed of transfer to be increased for the same values of $R_{min}$ and $R_{max}$. A greater tolerance for the resistance values of $R_{min}$ and $R_{max}$ provides the additional advantage of permitting a broader range of materials to be used for forming the resistance switching elements 202, 204.

Furthermore, advantageously the cell is capable of fast (in around 1 ns) write and read operations for the volatile storage portions, which may occur in a normal fashion irrespective of the programmed states of the non-volatile resistive elements. Furthermore, the write time for the non-volatile portion is also relatively fast (in around 35 ns in the case of an MRAM).

A further advantage of the memory cells described herein is that the circuit is compact, comprising only four transistors and two programmable resistors for the storage of one bit of non-volatile data and one bit of volatile data. Furthermore, the non-volatile data may be read without the need of additional transistors in each memory cell.

Furthermore, the resistance switching elements 202, 204 of FIGS. 2 and 8 are for example formed in a metal layer above a silicon layer in which the transistors 102, 104 or 802, 804 are formed. The positioning of these resistance switching elements 202, 204 connected directly to the ground voltage in FIG. 2 or directly to the supply voltage $V_{DD}$ in FIG. 8 is thus advantageous as a single via may be used from the silicon layer to one terminal of each resistance switching element, and the other terminal of each element can be connected directly to the corresponding supply rail rather than returning on another via to the silicon layer.

Having thus described at least one illustrative embodiment of the invention, various alterations, modifications and improvements will readily occur to those skilled in the art.

For example, it will be apparent to those skilled in the art that, while the invention has been described in relation to a memory array and FPGA, the memory cell described herein could be used in other types of memory devices, such as registers or flip-flops.

It will be apparent to those skilled in the art that the ground voltage described herein may be at 0 V, or more generally at any supply voltage $V_{SS}$, that could be different from 0 V.

Furthermore, it will be apparent to those skilled in the art that the variations in the threshold voltages between the transistors 102, 104 and the transistors 110, 112 of the four-transistor memory cell 200 of FIG. 2, or the corresponding transistors of the memory cell 800 of FIG. 8, could be achieved in part by the selection of particular bulk voltages applied to each transistor.

Furthermore, while the various embodiments have been described in relation to MOS transistors, it will be apparent to those skilled in the art that the invention could be equally applied to other transistor technologies, such as bipolar transistors.

Furthermore, the features described in relation to the various embodiments could be combined in alternative embodiments in any combination.

The invention claimed is:

1. A memory device comprising:
   at least one memory cell comprising:
      a first transistor coupled between a first storage node and a first resistance switching element programmed to have a first resistance;
      a second transistor coupled between a second storage node and a second resistance switching element programmed to have a second resistance, a control terminal of said first transistor being coupled to said second storage node, and a control terminal of said second transistor being coupled to said first storage node;
      a third transistor coupled between said first storage node and a first access line; and
      a fourth transistor coupled between said second storage node and a second access line, wherein said third and fourth transistors are adapted to have a lower threshold voltage than said first and second transistors; and
   control circuitry adapted to store a data value at said first and second storage nodes by coupling said first and second storage nodes to a first supply voltage, the data value being determined by the relative resistances of the first and second resistance switching elements.

2. The memory device of claim 1, wherein said control circuitry is further adapted to isolate said first and second storage nodes from said first supply voltage after a time delay.

3. The memory device of claim 1, wherein said control circuitry is adapted to control said third and fourth transistors to connect said first and second storage nodes to said first and second access lines respectively.

4. The memory device of claim 3, wherein said control circuitry is adapted to couple said first and second access lines to a second supply voltage during a standby phase prior to storing said data value at said first and second storage nodes.

5. The memory device of claim 1, wherein said first and second resistance switching elements are respectively coupled between said first and second transistors and a second supply voltage.

6. The memory device of claim 1, further comprising programming circuitry adapted to program the resistances of said first and second resistance switching elements based on input data.

7. The memory device of claim 1, wherein said first and second resistance switching elements are one of:
   oxide resistive elements;
   conductive bridging elements;
   phase change elements;

programmable metallization elements;
spin-torque-transfer elements; and
field-induced magnetic switching elements.

8. The memory device of claim 7, wherein said first and second resistance switching elements are thermally assisted switching elements, the memory device further comprising heating circuitry arranged to heat said first and second resistance switching elements by passing a current through them.

9. The memory device of claim 8, wherein said heating circuitry is adapted to couple a third supply voltage to said first and second storage nodes.

10. The memory device of claim 1, wherein said first transistor is the only transistor of a first inverter of said at least one memory cell, and said second transistor is the only transistor of a second inverter of said at least one memory cell.

11. A random access memory comprising an array of the memory devices of claim 1.

12. A field programmable gate array comprising at least one multiplexer comprising an input coupled to at least one of the memory devices of claim 1.

13. A field programmable gate array comprising:
a plurality of configurable logic blocks; and
at least one switching block adapted to interconnect said plurality of configurable logic blocks, wherein said at least one switching block comprises the memory device of claim 1.

14. A method of transferring a data value from non-volatile storage of a memory cell to first and second volatile storage nodes of said memory cell, wherein the memory cell comprises a first transistor coupled between said first storage node and a first resistance switching element programmed to have a first resistance; a second transistor coupled between said second storage node and a second resistance switching element programmed to have a second resistance, a control terminal of said first transistor being coupled to said second storage node, and a control terminal of said second transistor being coupled to said first storage node; a third transistor coupled between said first storage node and a first access line; and a fourth transistor coupled between said second storage node and a second access line, wherein said third and fourth transistors are adapted to have a lower threshold voltage than said first and second transistors, the method comprising:
coupling said first and second storage nodes to a first supply voltage, the data value being determined by the relative resistances of the first and second resistance switching elements.

15. The method of claim 14, further comprising, a first time period after coupling said first and second storage nodes to said first supply voltage, the step of isolating said first and second storage nodes from said first supply voltage.

16. The method of claim 14, wherein coupling said first and second storage nodes to said first supply voltage comprises activating a third transistor coupled between said first storage node and said first supply voltage, and activating a fourth transistor coupled between said second storage node and said first supply voltage.

* * * * *